United States Patent
Cox

(10) Patent No.: US 9,779,975 B2
(45) Date of Patent: *Oct. 3, 2017

(54) ELECTROSTATIC CARRIER FOR THIN SUBSTRATE HANDLING

(71) Applicant: Applied Materials, Inc., Santa Clara, CA (US)

(72) Inventor: Michael S. Cox, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/353,538

(22) Filed: Nov. 16, 2016

(65) Prior Publication Data

US 2017/0062261 A1    Mar. 2, 2017

Related U.S. Application Data

(63) Continuation of application No. 14/451,167, filed on Aug. 4, 2014, now Pat. No. 9,536,768.

(60) Provisional application No. 61/862,471, filed on Aug. 5, 2013.

(51) Int. Cl.
*H01T 23/00* (2006.01)
*H01L 21/683* (2006.01)

(52) U.S. Cl.
CPC ................. *H01L 21/6833* (2013.01)

(58) Field of Classification Search
CPC .................................................. H01L 21/6833
USPC .......................................................... 361/234
See application file for complete search history.

(56) References Cited

U.S. PATENT DOCUMENTS

| | | | |
|---|---|---|---|
| 5,117,121 A | 5/1992 | Watanabe et al. |
| 5,250,137 A | 10/1993 | Arami et al. |
| 5,528,451 A | 6/1996 | Su |
| 5,789,843 A | 8/1998 | Higuchi et al. |
| 5,880,924 A | 3/1999 | Kumar et al. |
| 5,982,607 A | 11/1999 | Burkhart et al. |

(Continued)

FOREIGN PATENT DOCUMENTS

| | | |
|---|---|---|
| EP | 0806797 A2 | 11/1997 |
| JP | H04237148 A | 8/1992 |

(Continued)

OTHER PUBLICATIONS

International Search Report and Written Opinion for International Application No. PCT/US2014/048065.

(Continued)

*Primary Examiner* — Stephen W Jackson
(74) *Attorney, Agent, or Firm* — Patterson + Sheridan LLP

(57) ABSTRACT

Embodiments provided herein generally relate to an electrostatic chuck (ESC). The ESC may comprise a reduced number of stress initiation points, such as holes through the ESC, which may improve the mechanical integrity of the ESC. Electrodes disposed within the ESC may be connected to electrical contacts and a power source via conductive leads, which may be coupled or formed along a peripheral edge of the ESC. Thus, the need for holes formed in the ESC may be reduced or eliminated. In addition, gas channels may be formed on a top surface, a bottom surface, or both. The gas channels may reduce or eliminate the need for a gas channel formed through the ESC and may facilitate heat transfer between a substrate support, the ESC, and a substrate coupled to the ESC.

20 Claims, 4 Drawing Sheets

(56) References Cited

U.S. PATENT DOCUMENTS

| | | |
|---|---|---|
| 5,982,986 A | 11/1999 | Davenport |
| 6,678,143 B2 | 1/2004 | Masuda et al. |
| 6,768,627 B1 | 7/2004 | Kitabayashi et al. |
| 6,781,812 B2 | 8/2004 | Fuwa et al. |
| 7,804,675 B2 | 9/2010 | Poh |
| 7,881,036 B2 | 2/2011 | Fujisawa et al. |
| 7,916,447 B2 | 3/2011 | Kobayashi et al. |
| 8,125,756 B2 | 2/2012 | Poh |
| 8,238,072 B2 | 8/2012 | Fujisawa et al. |
| 8,325,457 B2 | 12/2012 | Park et al. |
| 8,335,070 B2 | 12/2012 | Poh |
| 8,503,156 B2 | 8/2013 | Ray et al. |
| 8,730,644 B2 | 5/2014 | Fujisawa et al. |
| 9,287,806 B2 | 3/2016 | Park |
| 9,508,584 B2 * | 11/2016 | Cox .................. H01L 21/6833 |
| 9,536,768 B2 * | 1/2017 | Cox .................. H01L 21/6833 |
| 2008/0062609 A1 | 3/2008 | Himori et al. |
| 2012/0227886 A1 | 9/2012 | Hsiao et al. |
| 2015/0331337 A1 | 11/2015 | Sundarrajan et al. |
| 2016/0064267 A1 | 3/2016 | Toh et al. |

FOREIGN PATENT DOCUMENTS

| | | |
|---|---|---|
| JP | H09-162272 A | 6/1997 |
| JP | 2002-357838 A | 12/2002 |
| JP | 2003-179128 A | 6/2003 |
| JP | 2003-243493 A | 8/2003 |
| JP | 2003-282692 A | 10/2003 |
| JP | 2005-109358 A | 4/2005 |
| JP | 2008-085245 A | 4/2008 |
| JP | 04237148 B2 | 3/2009 |

OTHER PUBLICATIONS

Office Action for U.S. Appl. No. 14/451,167 dated Apr. 21, 2016.

Search Report and Office Action for Taiwan Application No. 103126239 dated Jul. 7, 2017.

Office Action for Korean Application No. 10-2016-7005660 dated Jul. 27, 2017.

\* cited by examiner

ELECTROSTATIC CARRIER FOR THIN SUBSTRATE HANDLING

CROSS-REFERENCE TO RELATED APPLICATIONS

This application is a continuation of U.S. patent application Ser. No. 14/451,167, filed Aug. 4, 2014, which claims benefit of U.S. Provisional Patent Application No. 61/862,471, filed Aug. 5, 2013, both of which are hereby incorporated by reference in their entirety.

BACKGROUND

Field

Embodiments described herein generally relate to an electrostatic chuck (ESC). More specifically, embodiments described herein relate to an improved electrostatic carrier design for thin substrate handling.

Description of the Related Art

In the processing of substrates, such as semiconducting substrates and displays, the substrate is held on a support in a process chamber during processing. The support can include an ESC that has an electrode capable of being electrically biased to hold the substrate on the support. The support can comprise a pedestal that supports the ESC in the chamber, and may be capable of raising or lowering the height of the ESC and substrate. The pedestal can also provide a protective enclosure for connecting wires, gas tubes, etc., that connect to portions of the support.

In some plasma processes used to process the substrate, energized gases are used to process the substrate by, for example, etching or depositing material on the substrate, or to clean surfaces in the chamber. These energized gases can comprise highly corrosive species, such as chemical etchants, as well as energized ionic and radical species that can erode portions of the ESC. The eroded ESC can be problematic because the damaged ESC may not provide the desired electrical characteristics for processing substrate or holding substrates. Also, particles that have eroded from the ESC can contaminate substrates being processes within the chamber.

ESC's made of ceramics may be desirable because they have improved resistance to corrosion by energized process gases, and can maintain their structural integrity even at high substrate processing temperatures exceeding several hundred degrees centigrade. However, a problem with conventional supports with integrated ESC's is that thermal expansion mismatch can occur between the ceramic ESC and the supporting pedestal, especially during substrate processes performed at high temperatures. The difference in thermal expansion coefficients of ceramic material and the metal pedestal can result in thermal and mechanical stresses that can cause the ceramic to fracture or chip.

Moreover, ceramic ESC's having multiple holes formed therethrough may be especially susceptible to cracking. Holes for vias used to couple electrodes within the ESC to a power source may be one example of a stress point which may induce cracking or fracturing of the ceramic material. The holes are generally considered inherent weak points in the mechanical integrity of the ESC. When an ESC is cracked or fractured, it may lose the ability to effectively retain a substrate and particle generation may be increased. In addition, the need to constantly replace cracked ESC's may be expensive and wasteful.

Thus, what is needed in the art is an ESC having improved mechanical integrity and reduced or eliminated stress initiation points while being able to maintain desirable electrostatic coupling characteristics.

SUMMARY

In one embodiment, an electrostatic chuck is provided. The electrostatic chuck may include a substantially rigid support layer having a bottom surface defining a bottom of the electrostatic chuck, a first electrode, and a dielectric layer having a top surface defining a top of the electrostatic chuck. The first electrode may be disposed between the top surface of the dielectric layer and the support layer. The support layer, first electrode, and dielectric layer may form a unitary body and a first connector may be coupled to the first electrode and may be exposed to the bottom of the electrostatic chuck. A first lead may be formed on a peripheral surface of the support layer and the dielectric layer connecting the first connector and the first electrode.

In another embodiment, an apparatus for chucking a substrate is provided. The apparatus may include a support member and an electrostatic chuck disposed on a top surface of the support member. The electrostatic chuck may include a substantially rigid support layer having a bottom surface defining a bottom of the electrostatic chuck, a first electrode at least partially interleaved with a second electrode, and a dielectric layer having a top surface defining a top of the electrostatic chuck. The first and second electrodes may be disposed between the top surface of the dielectric layer and the top surface of the support layer. Leads may electrically couple the first and second electrode to connectors disposed on the support layer and the leads may be formed on a peripheral surface of the support layer and the dielectric layer.

In yet another embodiment, an electrostatic chuck is provided. The electrostatic chuck includes a substantially rigid support layer having a bottom surface defining a bottom of the electrostatic chuck, a first electrode, a second electrode at least partially interleaved with the first electrode, and a dielectric layer having a top surface defining a top of the electrostatic chuck. The first electrode may be disposed between the top surface of the dielectric layer and the support layer. The support layer, first electrode, second electrode, and dielectric layer may form a unitary body. A first connector may be coupled to the first electrode and may be exposed to the bottom of the electrostatic chuck. A first lead may be formed on a peripheral surface of the support layer and the dielectric layer and may connect the first connector and the first electrode. A second connector may be coupled to the second electrode and may be exposed to the bottom of the electrostatic chuck. A second lead may be formed on the peripheral surface of the support layer and the dielectric layer and may the second connector and the second electrode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments provided herein generally relate to an electrostatic chuck (ESC). The ESC may comprise a reduced number of stress initiation points, such as holes through the ESC, which may improve the mechanical integrity of the ESC. Electrodes disposed within the ESC may be connected to electrical contacts and a power source via conductive leads, which may be coupled or formed along a peripheral exterior surface of the ESC. Thus, the need for holes formed in the ESC may be reduced or eliminated. In some embodiments, gas channels may be formed on a top surface, a bottom surface, or both. The gas channels may reduce or eliminate the need for a gas channel formed through the ESC and may facilitate heat transfer between a substrate support, the ESC, and a substrate coupled to the ESC.

Figure 1:
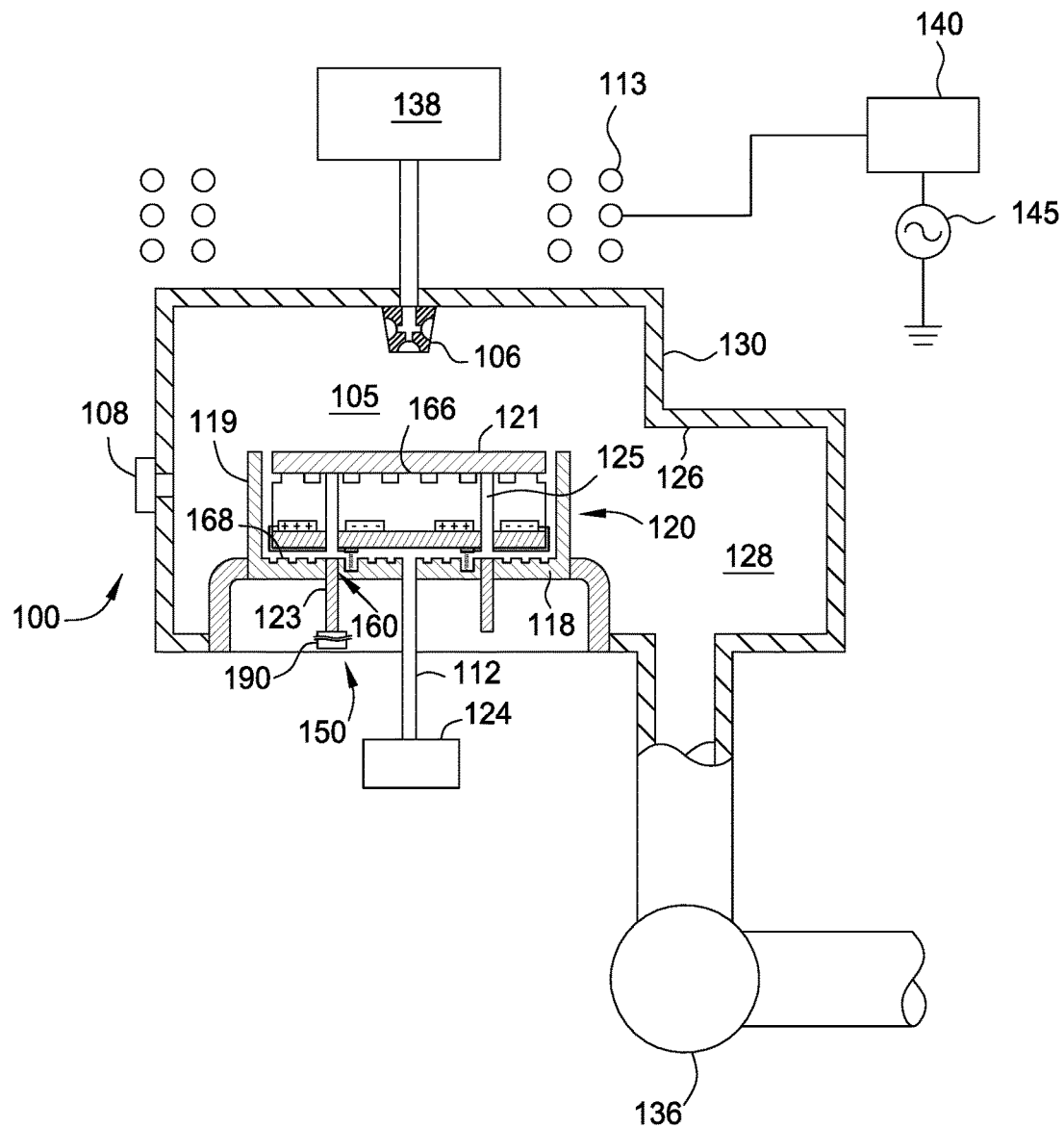
FIG. 1 is a schematic, cross-sectional view of a processing chamber having a substrate support.

FIG. 1 is a schematic, cross-sectional view of a vacuum processing chamber 100 that includes one embodiment of a substrate support 150 and ESC 120. The ESC 120 is configured to retain a substrate 121 thereon during processing. The ESC 120 may be especially useful for processing thin substrates 121. Although the processing chamber 100 is illustrated as an etching chamber, other types of processing chambers, such as deposition, ion implant, anneal, plasma treating, and others, may be adapted to utilized at least one of the substrate support and ESC described herein.

The processing chamber 100 generally includes walls 130, and a nozzle 106 which define a process volume 105. The process volume 105 may be accessed through a slit valve opening 108 such that the substrate 121 may be robotically transferred in and out of the chamber 100. An exhaust region 128 may comprise walls 126 and may be coupled to a vacuum pump 136 which may be adapted to exhaust processing gases from the process volume 105 through the exhaust region 128 and out of the chamber 100.

The substrate support 150 may be disposed within the chamber 100. The substrate support 150 may comprise a substrate support body 118 which may be disposed within the process volume 105. Sidewall 119 may extend from a surface 168 of the support body 118. The ESC 120 and optionally the substrate 121 may be disposed within the sidewall 119. The sidewall 119 may substantially circumscribe the ESC 120 and the substrate 121 and be spaced apart from the ESC 120 and substrate 121. The support body 118 may be stationary as shown in FIG. 1, or may be coupled to an actuator to raise and lower the substrate support body 118. The support body 118 includes a plurality of lift pin holes 160. The ESC 120 is configured to retain a substrate 121 thereon during processing. The ESC 120 includes lift pins holes 125 that align with the plurality of lift pin holes 160.

A plurality of lift pins 123 may be moveably disposed through the holes 160, 125 of the support body 118 and ESC 120. The plurality of lift pins 123 are interfaced in an actuator 190 which displaces the lift pins 123 through the support body 118 and ESC 120 between a first or lowered position that is flush with or below a substrate support surface 166 of the ESC 120 and a second or elevated position that is extended above the support surface 166. In the first position, the substrate 121 is seated on the support surface 166. In the second position, the substrate 121 is spaced above the support surface 166 to allow robotic transfer of the substrate into and out of the processing chamber 100.

In relation to the ESC 120, the support body 118 may include a gas conduit 112 and electrical conduits (not shown in FIG. 1) which will be described in greater detail with regard to FIG. 2 for providing power and backside gas to the ESC 120. The support body 118 may also include heating and/or cooling elements (not shown) adapted to maintain the support body 118 at a desired temperature. The heating and/or cooling elements may be resistive heaters, fluid conduits and the like.

The processing chamber 100 also includes a gas delivery apparatus for providing process and/or cleaning gases to the processing chamber 100. In the embodiment depicted in FIG. 1, the gas delivery apparatus is in the form of at least one nozzle 106 formed through the chamber walls 130. A gas panel 138 may be coupled to the nozzle 106 formed through the walls 130 to provide process gases to the process volume 105 through gas passages formed through the nozzle 106. The gas panel 138 may include a silicon-containing gas supply source, an oxygen containing gas supply source, and a nitrogen-containing gas supply source, or other gases suitable for processing the substrate within the chamber 100.

A plasma generator may also be coupled to the chamber 100. The plasma generator may comprise a signal generator 145 coupled to an electrode or antenna. The signal generator 145 generally provides energy at a frequency suitable to form and/or maintain a plasma in the chamber 100. For example, the signal generator 145 may provide a signal at a frequency of about 50 kHz to about 2.45 GHz. The signal generator 145 may be coupled to the electrode through a matching network 140 to minimize reflected power during use.

The electrode may be an antenna comprising at least one RF coil 113. The RF coil 113 may be disposed above the chamber 100 and may be configured to inductively coupled RF energy to the process gas provided to the process volume 105 through the nozzle 106 from the gas panel 138.

Figure 2:
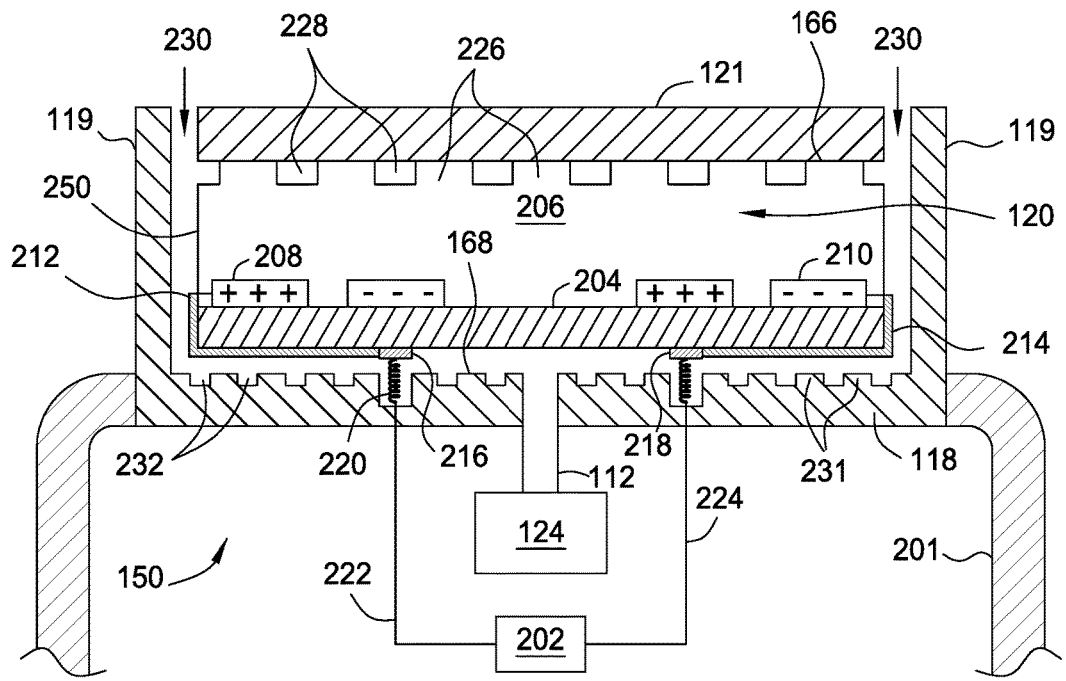
FIG. 2 is a schematic, slightly exploded cross-sectional view of one embodiment an ESC coupled to a substrate support.

FIG. 2 is a schematic, slightly exploded cross-sectional view of the ESC 120 disposed on the support body 118. Although not shown in FIG. 2, holes 125 may be disposed within the ESC 120 to facilitate movement of lift pins through the ESC 120 as will be described in greater detail with reference to FIG. 4. The ESC 120 is depicted as being coupled to the support body 118. Although shown as being spaced from the support body 118 for the sake of clarity, the ESC 120 is secured to the surface 168 of the support body 118 during processing. The ESC 120 may comprise a support layer 204 and a dielectric layer 206. The support layer 204 may be formed from a material capable of supporting the dielectric layer 206 and having desirable heat transfer properties, such as glass, ceramic materials such as aluminum nitride or aluminum oxide, or metallic material and semiconductor materials, such as molybdenum, silicon or silicon-aluminum alloy. The dielectric layer 206 may be formed from a dielectric material, such as a ceramic material or glass, or may be multiple layers of dielectric material laminated together. Suitable examples of ceramic materials or dielectric materials include polymers (i.e. polyimide), sapphire, silicon oxide, such as quartz or glass, aluminum oxide, aluminum nitride, yttrium containing materials, yttrium oxide, yttrium-aluminum-garnet, titanium oxide, titanium nitride, silicon carbide, and the like. The materials selected for the support layer 204 and dielectric layer 206 may have similar coefficients of thermal expansion to reduce the probability of mechanical stress between the layers.

The ESC 120 may comprise at least one electrode energizable to chuck the substrate 121 disposed on the support surface 166. In the embodiment depicted in FIG. 2, a first electrode 208 and a second electrode 210 are shown. The first electrode 208 and the second electrode 210 may be disposed on the support layer 214 and may be adapted to electrostatically couple the substrate 121 to the ESC 120. The ESC 120 may be substantially circular or the ESC may obtain other shapes, such as a square or rectangle. The first electrode 208 and the second electrode 210 may comprise a plurality of interleaving fingers which are adapted to provide a desirable electrostatic chucking force. The interleaving fingers will be discussed in greater detail with regard to FIG. 4.

The first electrode 208 is electrically coupled to a power source 202 through a first electrode lead 212, a first connector 216, a conductor 220, and a first source lead 222. The first electrode 208 may be fabricated from a metallic material having a coefficient of thermal expansion similar to the adjacent material of the dielectric layer 206. The first electrode lead 212 may be fabricated from an electrically conductive material, such as copper or aluminum, and may be formed as a unitary structure with the first electrode 208, for example, using a single deposition process to simultaneously form the lead 212 and the electrode 208. The first connector 216 may be formed on the support layer 204 and may also be fabricated from an electrically conductive material, such as copper or aluminum. As shown, the first connector 216 is in contact with the conductor 220 of the support body 118. When the ESC 120 is lifted from the substrate support 118 for removal from the chamber, the conductor 220 may extend beyond the surface 168 of the support body 118. The conductor 220, such as a spring, may be fabricated from an electrically conductive material, such as copper or aluminum. The conductor 220 may be coupled to the support body 118, such as by soldering, and the first source lead 222 may be electrically coupled to the conductor 220. The first source lead 222 couples the conductor 220 to the power source 202. The first source lead 222 may also be fabricated from an electrically conductive material, such as copper or aluminum.

The second electrode 210 may be electrically coupled to the power source 202 through a second electrode lead 214, a second connector 218, the conductor 220, and a second source lead 224. The second electrode 210 and associated elements may be arranged similar to the elements described in regard to the first electrode 208 described above and as such, the description of which will be omitted for the sake of brevity.

The first lead 212 and the second lead 214 may be formed on a peripheral exterior surface 250 of the dielectric layer 206 and the support layer 204. As such, the leads 212, 214 do not extend downwardly through vias or holes formed in the ESC 120 to the connectors 216, 218 as routed in conventional ESC's. Thus the necessity for holes formed in the ESC 120 is reduced or eliminated and the mechanical integrity of the ESC 120 may be increased. The leads 212, 214 may be formed on the peripheral exterior surface 250 of the ESC 120 by PVD deposition, a plating processes, of a screen printing process. It is also contemplated that the leads 212, 214 may also be coated with an insulating material to prevent undesirable electrical shorting if the leads 212, 214 were to contact another electrically conductive apparatus, such as the support body 118.

In operation, a positive charge may be applied to the first electrode 208 and a negative charge may be applied to the second electrode 210 to generate an electrostatic force when power is provided from the power source 202. During chucking, the electrostatic force generated from the electrodes 208, 210 chucks and holds the substrate 121 disposed thereon in a secured position. As the power supplied from the power source 202 is turned off, the charges generated in the electrodes 208, 210 are extinguished, releasing the substrate 121 held on the ESC 120. In some embodiments, a short, reverse polarity may be utilized to more efficiently dechuck the substrate 121.

The sidewall 119 may substantially circumscribe the ESC 120 and be spaced apart from the ESC 120 a distance to form a plenum 230. The gas conduit 112 may be coupled to a gas source 124 and may extend through the support body 118 to the surface 168. The gas conduit 112 may be adapted to provide a gas, such as helium, hydrogen, nitrogen, argon, or other inert gases, to a region between the ESC 120 and the substrate support 118 and between the ESC 120 and the substrate 121 via the plenum 230. The gases may be adapted to facilitate heat transfer between the ESC 120 and the support body 118 and the ESC 120 and the substrate 121, respectively.

The ESC 120 may additionally comprise one or more gas channels 228. The gas channels 228 may be formed on the support surface 166 of the ESC 120 which contacts the substrate 121. The one or more gas channels 228 may be arranged in various orientations, such as grid pattern. Gas provided from the gas source 124 through the gas conduit 112 to the plenum 230 may disperse through the one or more gas channels 228 to facilitate heat transfer between the substrate 121 and the ESC 120. It is contemplated that a depth of the one or more gas channels 228 may be adapted to facilitate heat transfer by conduction. One or more dividers 226, such as posts or other geometric forms, may separate and define the one or more gas channels 228. The dividers 226 may contact the substrate 121 and may extend from the one or more gas channels 228 several microns, such as between about 1 μm and about 10 μm, for example, between about 2 μm and about 5 μm. The gas channels 228 may extend through the peripheral exterior surface 250 of the ESC 120 so that gas present in the plenum 230 may travel through the gas channels 228 underneath the substrate 121.

The support body 118 may additionally comprise one or more gas channels 232. The gas channels 232 may be formed in the surface 168 of the support body 118 which may contact the ESC 120. The one or more gas channels 232 may be arranged in various orientations, such as grid pattern. Gas provided from the gas source 124 through the gas conduit 112 may disperse through the one or more gas channels 232 to facilitate heat transfer between the ESC 120 and the support body 118. One or more dividers 231, such as posts or other geometric forms, may separate and define the one or more gas channels 232. The surface 168 of the dividers 231 may contact the ESC 120 and may extend from the one or more gas channels 232 several microns, such as between about 1 μm and about 10 μm, for example, between about 2 μm and about 5 μm. The gas channels 232 may be formed in the support body 118 by any suitable method, such as machining, abrasive blasting, or etching. It is also contemplated that gas channels may be formed on the bottom of the support layer 204 instead of the substrate support 118.

Figure 3:
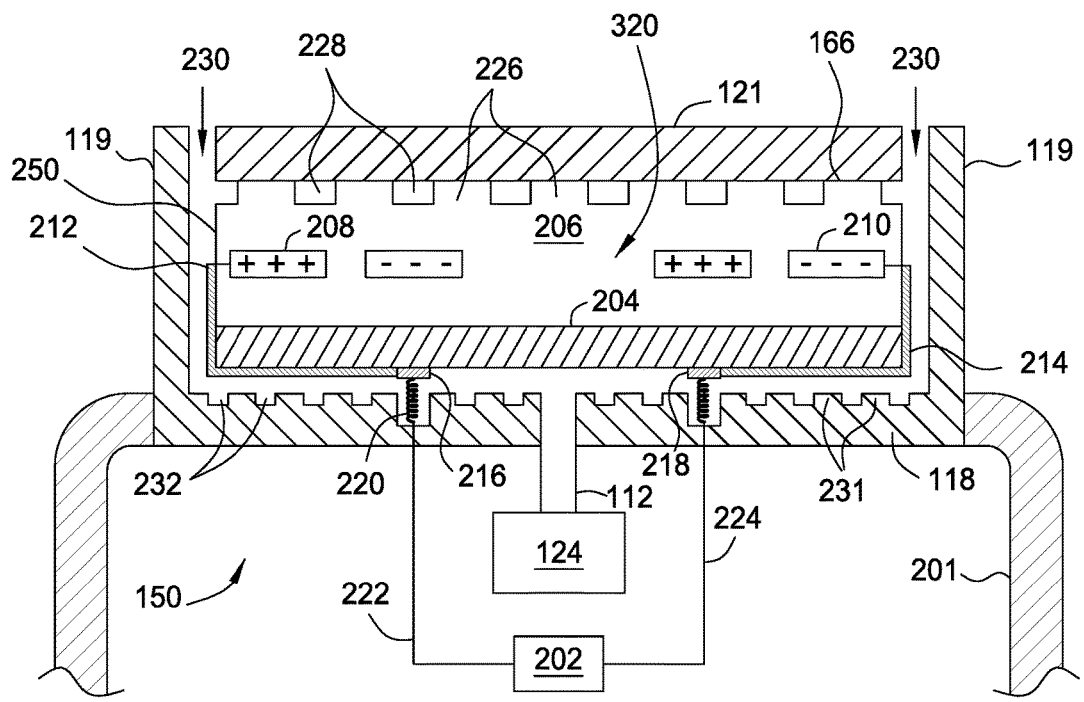
FIG. 3 is a schematic, slightly exploded cross-sectional view of one embodiment an ESC coupled to a substrate support.

FIG. 3 is a schematic, slightly exploded cross-sectional view of another embodiment of an ESC 320. The ESC 320 of FIG. 3 may be substantially similar to the ESC 120 of FIG. 2, the description of which may be found above. However, the first electrode 208 and the second electrode 210 may be disposed within the dielectric layer 206 and spaced from the support layer 214. It is contemplated that the leads 212, 214 without holes formed through the ESC 120, 320, are envisioned for monopolar (single electrode) and other conventional styles of electrostatic chucks while providing the same advantages of the disclosure.

Figure 4:
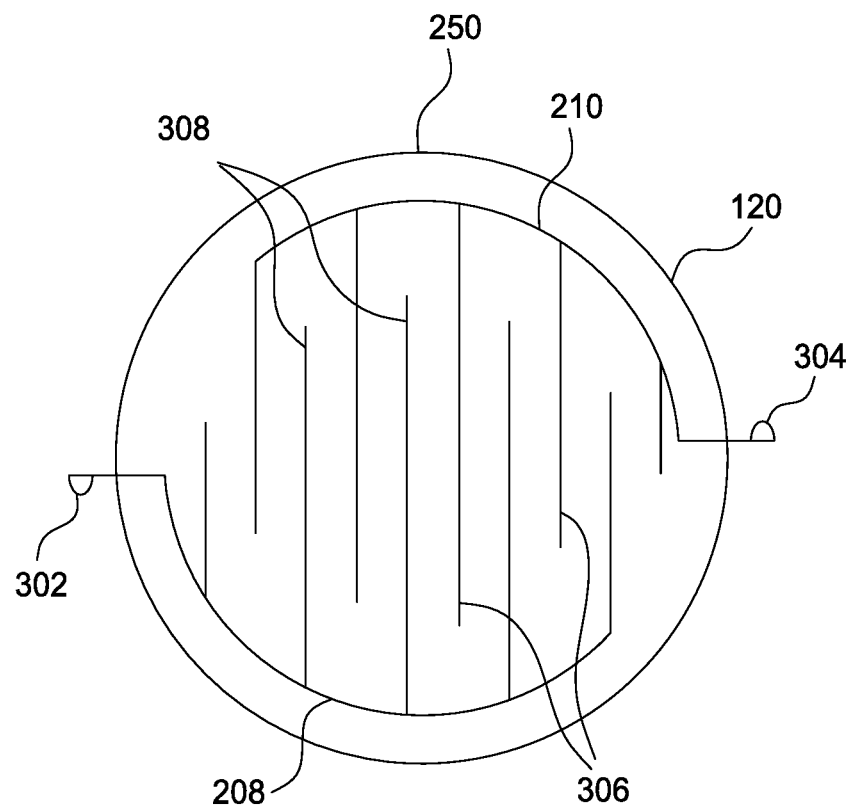
FIG. 4 is a top view of an ESC with electrodes exposed.

FIG. 4 is a top view of the ESC 120 depicting the electrodes 208, 210 exposed. The encapsulating dielectric layer is not shown to provide greater detail regarding the arrangement of the electrodes 208, 210. The first electrode 208 may have a polarity which is either positive or negative and the second electrode 210 may have a polarity opposite the first electrode 208. The first electrode 208 may extend along the peripheral exterior surface 250 of the ESC 120 and a plurality of first fingers 308 may extend from the first electrode 208 toward the middle of the ESC 120. The second electrode 210 may also extend along a portion near the peripheral exterior surface 250 of the ESC 120 and a plurality of second fingers 306 may extend from the second electrode 210 toward the middle of the ESC 120. The plurality of first fingers 308 and the plurality of second fingers 306 may form an at least partially interleaving pattern, such as alternating first and second fingers across the diameter of the ESC 120. It is contemplated that portions of the electrodes 208, 210 may be interleaved in other configurations.

The first electrode 208 may extend laterally outward of the peripheral exterior surface 250 of the ESC 120 and couple to a first electrode lead 302. The second electrode 210 may extend laterally outward of the peripheral exterior surface 250 of the ESC 120 and coupled to a second electrode lead 304. The first electrode lead 302 and the second electrode lead 304 may be positioned opposite one another across the diameter of the ESC 120.

Figure 5:
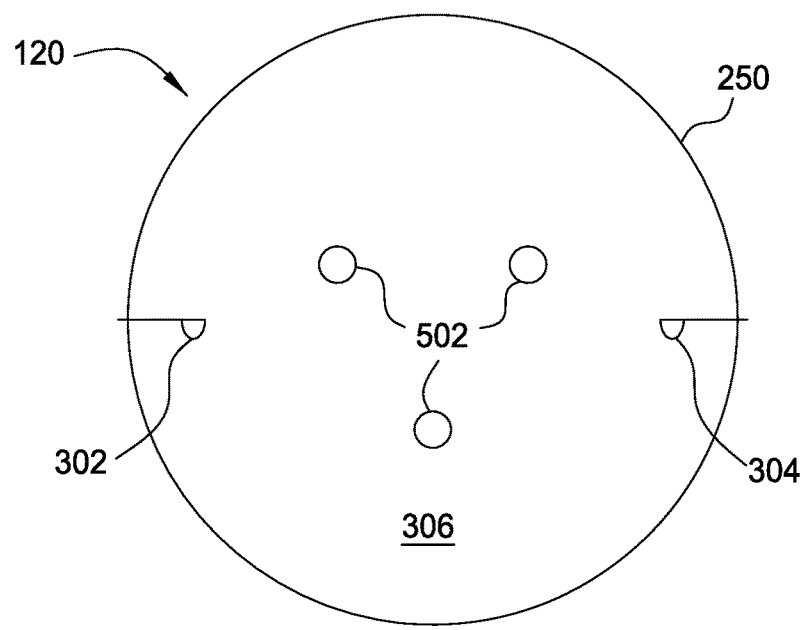
FIG. 5 is a bottom view of the ESC of FIG. 4.

FIG. 5 is a bottom view of the ESC 120 of FIG. 4. The first electrode lead 302 is shown routed from the first electrode 208 along the peripheral exterior surface 250 of the ESC 120 and onto a bottom 306 of the ESC 120, which may be the support layer 214. Similar to the first electrode lead 302, the second electrode lead 304 is shown as routed along the peripheral exterior surface 250 to the bottom 306 of the ESC 120. The first electrode lead 302 may be coupled to the connector 216. The second electrode lead 304 may be coupled to the connector 218. A plurality of lift pins holes 502 are shown extending through the ESC 120. It is contemplated that lift pin holes may be unnecessary if lift fingers or a hoop are utilized to transfer the ESC 120.

Figure 6:
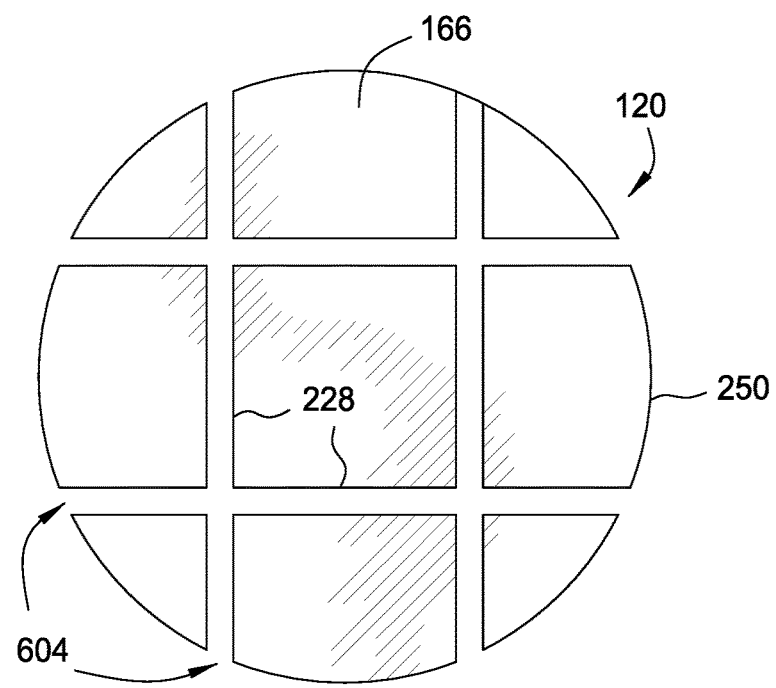
FIG. 6 is a top view of an ESC.

FIG. 6 is a top view of the ESC 120. The gas channels 228 may be formed in the support surface 166 of the ESC 120 and may form various patterns, such as a grid pattern. The gas channels 228 may be open to and extend from the peripheral exterior surface 250 of the ESC 120 through interior regions of the ESC 120. Openings 604 may be formed in the peripheral exterior surface 250 of the ESC 120 where the gas channels 228 are formed. Thus, gas may travel from a region beyond the peripheral exterior surface 250 through the gas channels 228 across the ESC 120. Gas may flow into and out of the gas channels 228 through the openings 604. As such, heat transfer between the ESC 120 and a substrate retained on the ESC 120 may be improved.

The ESC 120 may require less material and fewer processing steps to manufacture than a conventional ESC. Thus, the cost of making and using the ESC 120 may be greatly reduced. Additionally, the mechanical integrity of the ESC 120 may be improved which may reduce the probability of breakage or cracking of the ESC 120. The elimination of holes for at least the leads, and in some embodiments, gas channels and lift pins, reduces stress initiation points which may improve the mechanical integrity of the ESC 120. Further, thermal conduction may be improved by the embodiments described herein.

While the foregoing is directed to embodiments of the present disclosure, other and further embodiments of the disclosure may be devised without departing from the basic scope thereof, and the scope thereof is determined by the claims that follow.

The invention claimed is:

1. An electrostatic chuck, comprising:
   a support layer having a bottom surface defining a bottom of the electrostatic chuck;
   a dielectric layer having a top surface defining a top of the electrostatic chuck, the dielectric layer disposed on the support layer
   a first electrode disposed between the top surface of the dielectric layer and the support layer;
   a first connector coupled to the bottom surface of the support layer; and
   a first lead connecting the first connector and the first electrode.

2. The electrostatic chuck of claim 1, wherein the first connector comprises a conductive pad.

3. The electrostatic chuck of claim 1, wherein the first lead is formed on a peripheral surface of the support layer and the dielectric layer.

4. The electrostatic chuck of claim 1, wherein the support layer and the dielectric layer comprise a glass or ceramic material.

5. The electrostatic chuck of claim 1, wherein the dielectric layer comprises a coefficient of thermal expansion about equal to a coefficient of thermal expansion of the support layer.

6. The electrostatic chuck of claim 1, wherein the first connector is configured to contact a conductive spring.

7. The electrostatic chuck of claim 1, further comprising:
   a second electrode, wherein the first electrode comprises a plurality of fingers interleaving with a plurality of fingers of the second electrode.

8. The electrostatic chuck of claim 1, wherein the top surface of the dielectric layer has gas channels formed therein, the gas channels open to the peripheral surface of the dielectric layer, wherein the dielectric layer has no through holes connected to the gas channels.

9. The electrostatic such of claim 7, further comprising:
   a second connector coupled to the second electrode and exposed to the bottom of the electrostatic chuck, wherein a second lead connecting the second connector and the second electrode are formed on the peripheral surface of the support layer and the dielectric layer.

10. An apparatus for chucking a substrate, comprising:
    a base member;
    an electrostatic chuck disposed on a top surface of the support member, the electrostatic chuck comprising:
       a support layer having a bottom surface defining a bottom of the electrostatic chuck;

a dielectric layer having a top surface defining a top of the electrostatic chuck;

first and second electrodes disposed between the top surface of the dielectric layer and the top surface of the support layer; and leads electrically coupling the first and second electrodes to connectors disposed on the support layer.

11. The apparatus of claim 10, wherein the top surface of the base member is adapted to receive the electrostatic chuck.

12. The apparatus of claim 10, wherein the electrostatic chuck further comprises:

one or more gas delivery grooves formed in the top surface of the electrostatic chuck, the gas delivery grooves open above the top surface of the base member.

13. The apparatus of claim 10, wherein no gas conduits are formed through the electrostatic chuck.

14. The apparatus of claim 10, wherein the electrostatic chuck and the base member have electrical connections configured to automatically engage and disengage in response to the position of the electrostatic chuck relative to the base member.

15. The apparatus of claim 10, wherein the support layer and the dielectric layer comprise a glass or ceramic material.

16. The apparatus of claim 10, wherein the leads are formed on a peripheral surface of the support layer and the dielectric layer.

17. The apparatus of claim 10, wherein the dielectric layer comprises a coefficient of thermal expansion about equal to a coefficient of thermal expansion of the support layer.

18. The apparatus of claim 10, wherein the first electrode comprises a plurality of fingers interleaving with a plurality of fingers of the second electrode.

19. The apparatus of claim 10, wherein a plenum is formed between a sidewall forming the recess and an electrostatic chuck coupled to the base member.

20. An electrostatic chuck, comprising:

a support layer having a top surface and a bottom surface defining a bottom of the electrostatic chuck;

a dielectric layer disposed on the top surface of the support layer, the dielectric layer having a top surface defining a top of the electrostatic chuck a first electrode disposed in the dielectric layer;

a second electrode disposed in the dielectric layer, the second electrode interleaved with the first electrode;

a first connector disposed on the bottom surface of the support layer and coupled to the first electrode via a first lead; and a second connector disposed on the bottom surface of the support layer and coupled to the second electrode via a second lead.

* * * * *